United States Patent
Chen

(10) Patent No.: US 12,088,258 B2
(45) Date of Patent: Sep. 10, 2024

(54) PREAMPLIFYING CIRCUIT

(71) Applicant: SUZHOU NOVOSENSE MICROELECTRONICS CO., LTD., Suzhou (CN)

(72) Inventor: Qihui Chen, Suzhou (CN)

(73) Assignee: SUZHOU NOVOSENSE MICROELECTRONICS CO., LTD., Suzhou (CN)

( * ) Notice: Subject to any disclaimer, the term of this patent is extended or adjusted under 35 U.S.C. 154(b) by 451 days.

(21) Appl. No.: 17/439,774

(22) PCT Filed: Nov. 4, 2019

(86) PCT No.: PCT/CN2019/115279
§ 371 (c)(1),
(2) Date: Sep. 15, 2021

(87) PCT Pub. No.: WO2021/077463
PCT Pub. Date: Apr. 29, 2021

(65) Prior Publication Data
US 2022/0190787 A1    Jun. 16, 2022

(30) Foreign Application Priority Data
Oct. 24, 2019    (CN) .......................... 201911017736.9

(51) Int. Cl.
*H03F 1/32*    (2006.01)
*H03F 3/183*    (2006.01)
(Continued)

(52) U.S. Cl.
CPC .............. *H03F 1/32* (2013.01); *H03F 3/183* (2013.01); *H03G 3/3005* (2013.01); *H04R 3/04* (2013.01);
(Continued)

(58) Field of Classification Search
CPC ........ H03F 1/32; H03F 3/183; H03F 2200/03; H03F 2200/126; H03F 2200/303;
(Continued)

(56) References Cited

U.S. PATENT DOCUMENTS 9,451,359 B2 *   9/2016  Mucha ..................... H04R 3/00
10,070,222 B1    9/2018  Ganta et al.
(Continued)

FOREIGN PATENT DOCUMENTS

| CN | 103888087 A | 6/2014 |
| CN | 104426363 A | 3/2015 |
| CN | 111181502 A | 5/2020 |

*Primary Examiner* — Hieu P Nguyen
(74) *Attorney, Agent, or Firm* — Birch, Stewart, Kolasch & Birch, LLP

(57) ABSTRACT

Provided is a preamplifying circuit, including a first amplifier and a second amplifier sequentially connected in series, wherein an output end of the second amplifier is connected to a circuit output end, and an input end of the first amplifier is connected to a circuit input end. The preamplifying circuit further includes a positive feedback branch including a diode group and a third amplifier, wherein one end of the diode group is connected to the input end of the first amplifier. The positive feedback circuit can positively feed part of signals back to the other end of the diode group, so that voltage drops at two ends of the diode group can be reduced, and harmonic distortion caused by nonlinearity of the diode group is reduced. Thus, the sound quality detected by a microphone sensor is improved.

9 Claims, 2 Drawing Sheets

(51) Int. Cl.
*H03G 3/30* (2006.01)
*H04R 3/04* (2006.01)

(52) U.S. Cl.
CPC ... *H03F 2200/03* (2013.01); *H03G 2201/103* (2013.01); *H04R 2430/01* (2013.01)

(58) Field of Classification Search
CPC .... H03F 1/3205; H03F 1/3264; H03F 1/3276; H03F 3/181; H03F 1/38; H03F 3/68; H03G 3/3005; H03G 2201/103; H03G 3/10; H04R 3/04; H04R 2430/01; H04R 19/04
USPC .......................... 330/278, 310, 98, 133, 150
See application file for complete search history.

(56) References Cited

U.S. PATENT DOCUMENTS 10,211,792 B2 * 2/2019 Fröhlich ................. H03F 3/187
2017/0359036 A1 12/2017 Fröhlich et al.

* cited by examiner

PREAMPLIFYING CIRCUIT

The present application is a 35 U.S.C. § 371 National Phase conversion of International PCT) Patent Application No. PCT/CN2019/115279, filed on Nov. 4, 2019, which claims priority to Chinese Patent Application No. 201911017736.9, filed on Oct. 24, 2019 and entitled "PRE-AMPLIFYING CIRCUIT", which is incorporated herein by reference in its entirety. The PCT International Patent Application was filed and published in Chinese.

TECHNICAL FIELD

The present invention relates to a preamplifying circuit, in particular to a preamplifying circuit for a microphone sensor.

BACKGROUND

With the continuous development of audio units, a microphone, as an energy device that can convert a sound signal into an electrical signal, has been widely applied to various electronic devices, and its basic function is to convert sound into an electrical signal for outputting. A microphone sensor usually requires a preamplifying circuit for amplifying the electrical signal.

Referring to FIG. 1 that shows a conventional preamplifying circuit, a diode D1 and a diode D2 are in inverse parallel connection, with one end of each grounded. When an input signal is large in amplitude, harmonic distortion generated by the diodes D1 and D2 is very large, which adversely affects signal output.

Referring to FIG. 2 that shows another improved preamplifying circuit, a diode D3 is in positive series connection with a branch of the diode D1, and a diode D4 is in positive series connection with a branch of the diode D2, based on FIG. 1. Then, theoretically, when an input signal is large in amplitude, the diodes D3 and D4 connected in series in the corresponding branches may correspondingly reduce harmonic distortion. However, in a general Complementary Metal Oxide Semiconductor (CMOS) process, a parasitic diode will be produced during fabrication of diodes, so it is difficult to realize a series connection effect in practice.

Therefore, it is necessary to design a new preamplifying circuit for a microphone sensor, which can reduce harmonic distortion.

SUMMARY

To solve one of the above-mentioned problems, the present invention provides a preamplifying circuit, including a first amplifier and a second amplifier sequentially connected in series, wherein an output end of the second amplifier is connected to a circuit output end, and an input end of the first amplifier is connected to a circuit input end. The preamplifying circuit further includes a positive feedback branch, including a diode group and a third amplifier, wherein one end of the diode group is connected to the input end of the first amplifier; an input end of the third amplifier is connected between the first amplifier and the second amplifier; an output end of the third amplifier is connected to the other end of the diode group; and the diode group includes a first diode and a second diode that are in inverse parallel connection.

As an improvement of the present invention, the positive feedback branch further includes a first capacitor, which is connected between the input end of the third amplifier and the output end of the first amplifier, and a second capacitor, which is connected between the input end of the third amplifier and the ground.

As a further improvement of the present invention, the preamplifying circuit further includes a filtering branch, and the filtering branch includes the first capacitor and an electrical device connected to the input end of the third amplifier.

As a further improvement of the present invention, the electrical device includes a third diode and a fourth diode that are in inverse parallel connection, one end of the electrical device is connected to the input end of the third amplifier, and the other end of the electrical device is connected to an external DC bias voltage supply.

As a further improvement of the present invention, the filtering branch is a high-pass filtering branch and allows an AC signal with the frequency of 20 Hz to 20 kHz to pass.

As a further improvement of the present invention, the preamplifying circuit further includes a DC biasing branch connected to the circuit input end and configured to provide a DC voltage for the circuit input end.

As a further improvement of the present invention, the DC biasing circuit includes an electrical device and an external DC bias voltage supply connected to the electrical device, wherein the electrical device includes a third diode and a fourth diode that are in inverse parallel connection, one end of the electrical device is connected to the input end of the third amplifier, and the other end of the electrical is connected to the external DC bias voltage supply.

As a further improvement of the present invention, the first amplifier is an amplifier with high impedance input and low impedance output, and has a gain valued 1.

As a further improvement of the present invention, the second amplifier has an adjustable gain.

As a further improvement of the present invention, the third amplifier is an amplifier with high impedance input and low impedance output, and has a gain valued 1.

Compared with the prior art, the present invention has the positive feedback branch with the third amplifier is adopted, which can feed part of signals back to the other end of the diode group, so that voltage drops at two ends of the diode group can be reduced. Further, harmonic distortion caused by nonlinearity of the diode group is reduced. Thus, the sound quality detected by a microphone sensor is improved.

DETAILED DESCRIPTION

To make those skilled in the art understand the technical solutions in the present invention better, the technical solutions in the embodiments of the present invention will be described clearly and completely with reference to the accompanying drawings in the embodiments of the present invention. It is apparent that the described embodiments are only part of embodiments of the present invention, rather than all of the embodiments. According to the described embodiments of the present invention, all other embodiments obtained by those of ordinary skill in the art without consuming any creative work shall fall within the scope of protection of the present invention.

Figure 1:
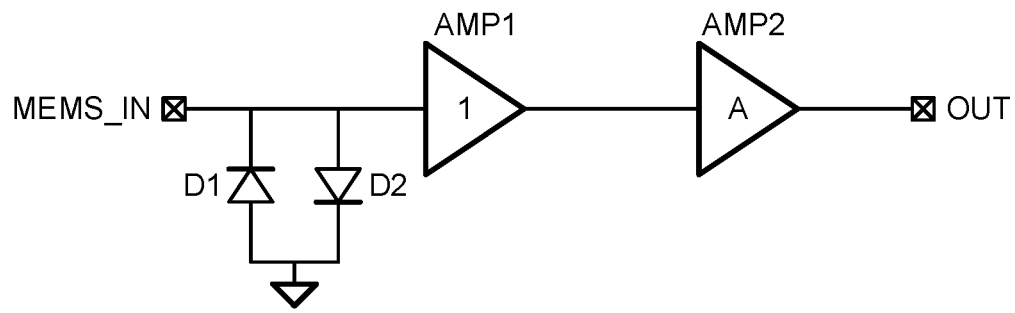
FIG. 1 is a circuit diagram of a preamplifying circuit in a first prior art.
Figure 2:
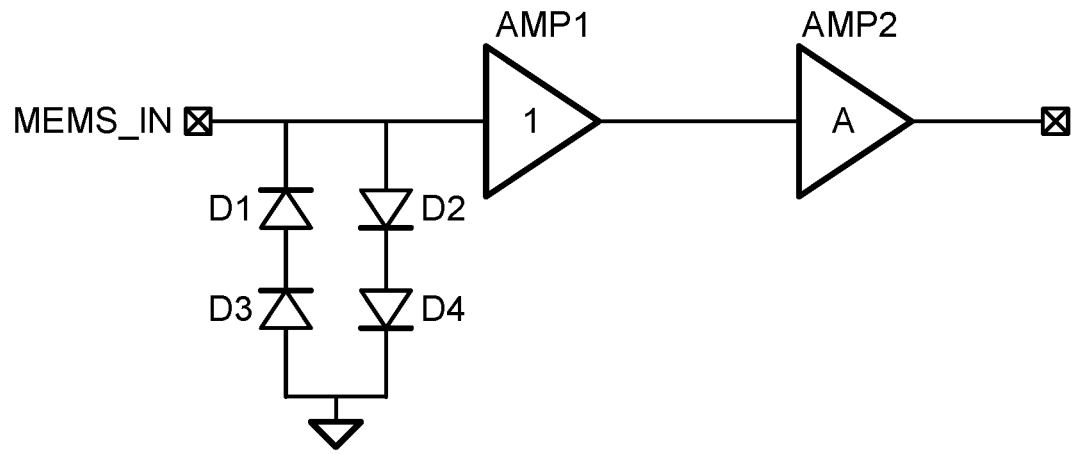
FIG. 2 is a circuit diagram of a preamplifying circuit in a second prior art.
Figure 3:
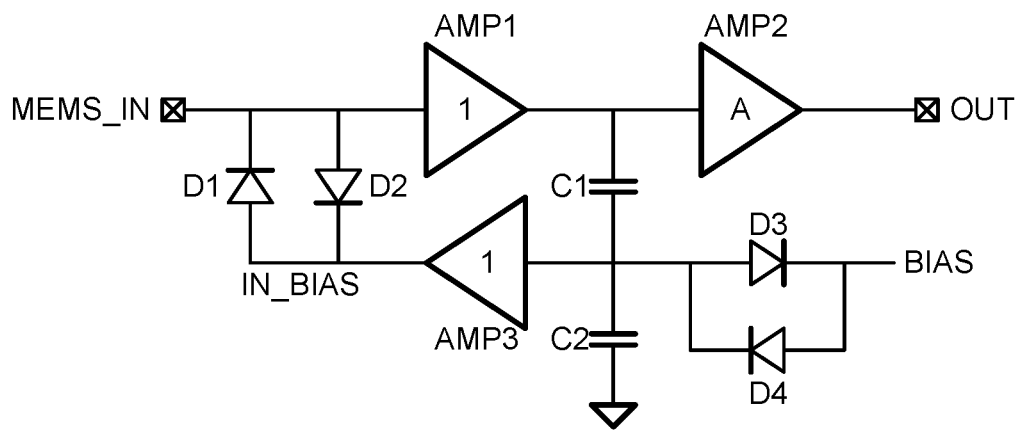
FIG. 3 is a circuit diagram of a preamplifying circuit in the present invention.

As shown in FIG. 3, the present invention provides a preamplifying circuit, including a first amplifier AMP1 and a second amplifier AMP2 sequentially connected in series. An output end of the second amplifier AMP2 is connected to a circuit output end, and an input end of the first amplifier AMP1 is connected to a circuit input end MEMS_IN.

It should be noted that the first amplifier AMP1, the second amplifier AMP2 and a third amplifier AMP3 described later are all operational amplifiers, and the operational amplifier includes a positive input end, a negative input end, and an output end. In this specific embodiment, for the ease of drawing, circuits at the positive input end and the negative input end of the operational amplifier are simplified, and neither the feedback polarity nor the feedback multiple of the operational amplifier is directly indicated. Not only including differential inputs, the first amplifier AMP1 and the third amplifier AMP3 also can be realized by including a single input end and a single output end, like a source follower.

The preamplifying circuit further includes a positive feedback branch, including a diode group and a third amplifier AMP3. One end of the diode group is connected to the input end of the first amplifier, an input end of the third amplifier AMP3 is connected between the first amplifier AMP1 and the second amplifier AMP2, an output end of the third amplifier AMP3 is connected to the other end of the diode group, and the diode group includes a first diode D1 and a second diode D2 that are in inverse parallel connection.

As the positive feedback branch is adopted in the present invention, it is obvious that the output ends of the first amplifier AMP1 and the third amplifier AMP3 are connected to the corresponding positive input ends to form the positive feedback branch. Negative input ends of the first amplifier AMP1 and the third amplifier AMP3 and their corresponding electrical connection structures are omitted in FIG. 3. Not only including differential inputs, the first amplifier AMP1 and the third amplifier AMP3 also can be realized by including a single input end and a single output end, like a source follower.

In addition, the positive feedback branch may positively feed part of signals back to the other end of the diode group, which may reduce amplitudes of AC signals at two ends of the diode group and voltage drops at two ends of the diode group. Thus, equivalent resistance of the diode group may be improved, and harmonic distortion caused by nonlinearity of the diode group is reduced. Therefore, the sound quality detected by a microphone sensor is improved.

It should be noted that the first diode D1 and the second diode D2 are in inverse parallel connection, which means that the input end of the first diode D1 is connected with the output end of the second diode D2, and the output end of the first diode D1 is connected with the input end of the second diode D2.

The positive feedback branch also includes a first capacitor C1, which is connected between the input end of the third amplifier AMP3 and the output end of the first amplifier AMP1, and a second capacitor C2, which is connected between the input end of the third amplifier AMP3 and the ground. The first capacitor C1 and the second capacitor C2 attenuate the AC signals, so that a positive feedback coefficient of the first amplifier AMP1 is smaller than 1, ensuring that the positive feedback branch of the first amplifier AMP1 will not produce oscillation and further guaranteeing the stability of the circuit structure.

The preamplifying circuit also includes a filtering branch, and the filtering branch includes the first capacitor C1 and an electrical device connected to the input end of the third amplifier AMP3. The first capacitor C1 is also connected to the input end of the third amplifier AMP3, and the electrical device may be a resistance component or an inductance component, or may be equivalent to a resistance component or an inductance component, so as to match with the first capacitor C1 and achieve a filtering effect.

In the present invention, the filtering branch is a high-pass filter, and allows an AC signal between 20 Hz and 20 kHz to pass, so that the AC signal between 20 Hz and 20 kHz may be fed back to the input end of the first amplifier AMP1. Moreover, the first capacitor C1 is connected between the output end of the first amplifier AMP1 and the input end of the third amplifier AMP3, so that the first capacitor C1 may isolate a DC signal at the output end of the first amplifier AMP1 and prevent the DC signal at the output end of the first amplifier AMP1 from entering the positive feedback branch.

Further, the electrical device in the filtering branch includes a third diode D3 and a fourth diode D4 that are in inverse parallel connection. One end of the electrical device is connected to the input end of the third amplifier AMP3, and the other end of the electrical device is connected to an external DC bias voltage supply used for powering up the third diode D3 and the fourth diode D4. The third diode D3 and the fourth diode D4 are also in inverse parallel connection, so the input end of the third diode D3 is connected to the output end of the fourth diode D4, and the output end of the third diode D3 is connected to the input end of the fourth diode D4. The third diode D3 and the fourth diode D4 are in inverse parallel connection. When the external DC bias voltage supply passes, there must be one diode positively conducted and the other diode reversely connected. Assuming that the third diode D3 is reversed with respect to the external DC bias voltage supply, the diode D3 has very large equivalent resistance, which is equivalent to an open circuit. The fourth diode D4 is in the connected circuit and also has large equivalent resistance, so that the electrical device is equivalent to a resistor with large resistance, and the electrical device and the first capacitor C1 may work together to achieve a filtering effect. However, a common resistor may not reach such high resistance, so in the present invention, the third diode D3 and the fourth diode D4 that are in inverse parallel connection are used as equivalent resistors.

Therefore, the third diode D3, the fourth diode D4 and the first capacitor C1 in this specific embodiment may be combined to achieve the function of a filter and to form a filtering branch. Certainly, if the electrical device is of other structures, e.g., an inductor assembly and a resistor assembly, the objective of the present invention may be achieved as long as filtering requirements of the filtering branch are satisfied.

The preamplifying circuit further includes a DC biasing branch connected to the circuit input end MEMS_IN and configured to provide a DC voltage for the circuit input end MEMS_IN, so that the circuit input end MEMS_IN may also receive the DC voltage of the external DC bias voltage supply to further reduce harmonic distortion.

The DC biasing branch includes the electrical device and an external DC bias voltage supply connected to the electrical device. Similarly, the electrical device includes the third diode D3 and the fourth diode D4 that are in inverse parallel connection. In this embodiment, in order to simplify the circuit, the third diode D3 and the fourth diode D4 are in inverse parallel connection are adopted, so that not only can DC biasing be performed on the circuit input end MEMS_IN, but also a high-pass filter may be formed. Certainly, the electrical device is connected to the positive input end of the third amplifier.

Certainly, if the electrical device in the DC biasing branch is of other circuit structures, it is within the scope of the present invention as long as the objective of the present invention may be achieved.

The first amplifier AMP1 is an amplifier with high impedance input and low impedance output, and has a gain valued 1. The third amplifier AMP3 is also an amplifier with high impedance input and low impedance output, and also has a gain valued 1. The second amplifier AMP2 has an adjustable gain, and the sensitivity consistency of the microphone sensor is improved by adjusting the gain of the second amplifier AMP2.

Therefore, in summary, the preamplifying circuit provided by the present invention is applied to a microphone sensor, and part of signals may be fed back to the end of the diode group away from the circuit input end MEMS_IN by the positive feedback branch, so that voltage drops at two ends of the diode group can be reduced, harmonic distortion caused by nonlinearity of the diode group can be further reduced, and the sound quality detected by the microphone sensor can be improved. In addition, since the electrical device which can serve as both a filtering branch and a DC biasing branch is added to the preamplifying circuit, the circuit is simplified and harmonic distortion is further reduced. In addition, the AC electrical signal at the output end of the first amplifier AMP1 is attenuated by the first capacitor C1 and the second capacitor C2, so that a positive feedback coefficient is smaller than 1, ensuring that the positive feedback circuit will not produce oscillation. Moreover, since both the first amplifier AMP1 and the third amplifier AMP3 have small gains, formation of oscillation can also be reduced.

In addition, it should be understood that although the description is described according to the embodiments, not every embodiment includes only one independent technical solution, that such a description manner is only for the sake of clarity, that those skilled in the art should take the description as an integral part, and that the technical solutions in the embodiments may be suitably combined to form other embodiments understandable by those skilled in the art.

The detailed descriptions set forth above are merely specific illustrations of feasible embodiments of the present invention, and are not intended to limit the scope of protection of the present invention. All equivalent embodiments or modifications that do not depart from the art spirit of the present invention should fall within the scope of protection of the present invention.

What is claimed is:

1. A preamplifying circuit, comprising a first amplifier and a second amplifier sequentially connected in series, wherein an output end of the second amplifier is connected to a circuit output end; an input end of the first amplifier is connected to a circuit input end; the preamplifying circuit being characterized by further comprising a positive feedback branch which comprises a diode group and a third amplifier, wherein one end of the diode group is connected to the input end of the first amplifier; an input end of the third amplifier is connected between the first amplifier and the second amplifier; an output end of the third amplifier is connected to the other end of the diode group; and the diode group comprises a first diode and a second diode that are in inverse parallel connection;

wherein the positive feedback branch further comprises a first capacitor, which is connected between the input end of the third amplifier and the output end of the first amplifier, and a second capacitor which is connected between the input end of the third amplifier and the ground.

2. The preamplifying circuit according to claim 1, further comprising a filtering branch, wherein the filtering branch comprises the first capacitor and an electrical device connected to the input end of the third amplifier.

3. The preamplifying circuit according to claim 2, wherein the electrical device comprises a third diode and a fourth diode that are in inverse parallel connection, one end of the electrical device is connected to the input end of the third amplifier, and the other end of the electrical device is connected to an external DC bias voltage supply.

4. The preamplifying circuit according to claim 2, wherein the filtering branch is a high-pass filtering branch and allows an AC signal with the frequency of 20 Hz to 20 kHz to pass.

5. The preamplifying circuit according to claim 1, further comprising a DC biasing branch connected to the circuit input end and configured to provide a DC voltage for the circuit input end.

6. The preamplifying circuit according to claim 5, wherein the DC biasing circuit comprises an electrical device and an external DC bias voltage supply connected to the electrical device, the electrical device comprises a third diode and a fourth diode that are in inverse parallel connection, one end of the electrical device is connected to the input end of the third amplifier, and the other end of the electrical device is connected to the external DC bias voltage supply.

7. The preamplifying circuit according to claim 1, wherein the first amplifier is an amplifier with high impedance input and low impedance output, and has a gain valued 1.

8. The preamplifying circuit according to claim 1, wherein the second amplifier has an adjustable gain.

9. The preamplifying circuit according to claim 1, wherein the third amplifier is an amplifier with high impedance input and low impedance output, and has a gain valued 1.

* * * * *